(12) United States Patent
Wennemuth et al.

(10) Patent No.: US 6,903,932 B2
(45) Date of Patent: Jun. 7, 2005

(54) COVERING ELEMENT FOR SUBASSEMBLIES

(75) Inventors: Ingo Wennemuth, München (DE); Volker Strutz, Tegernheim (DE); Uta Gebauer, München (DE)

(73) Assignee: Infineon Technologies AG, Munich (DE)

( * ) Notice: Subject to any disclaimer, the term of this patent is extended or adjusted under 35 U.S.C. 154(b) by 160 days.

(21) Appl. No.: 10/210,602

(22) Filed: Aug. 1, 2002

(65) Prior Publication Data

US 2003/0026077 A1 Feb. 6, 2003

(30) Foreign Application Priority Data

Aug. 1, 2001 (DE) .......................... 101 37 619

(51) Int. Cl.$^7$ ................................ H05K 7/20
(52) U.S. Cl. .................. 361/714; 361/760; 361/818; 361/797
(58) Field of Search ................ 361/714, 760, 361/752, 724, 816, 818, 797; 257/704, 728; 174/35 R, 51.2, 52.2

(56) References Cited

U.S. PATENT DOCUMENTS

| | | | | |
|---|---|---|---|---|
| 4,233,645 A | * | 11/1980 | Balderes et al. ............ 361/698 |
| 4,814,943 A | * | 3/1989 | Okuaki ....................... 361/783 |
| 5,477,008 A | * | 12/1995 | Pasqualoni et al. ........ 174/52.3 |
| 5,867,371 A | * | 2/1999 | Denzene et al. ............ 361/816 |
| 5,939,784 A | * | 8/1999 | Glenn ........................ 257/710 |
| 6,166,435 A | * | 12/2000 | Leu et al. ................... 257/704 |

FOREIGN PATENT DOCUMENTS

| | | |
|---|---|---|
| DE | 198 06 818 C1 | 11/1999 |
| EP | 1 093 159 A1 | 4/2001 |
| JP | 2000 299 396 A | 10/2000 |

* cited by examiner

*Primary Examiner*—Randy W. Gibson
*Assistant Examiner*—Hung S. Bui
(74) *Attorney, Agent, or Firm*—Laurence A. Greenberg; Werner H. Stemer; Ralph E. Locher

(57) ABSTRACT

A covering element for covering subassemblies having a substrate and at least one component disposed thereon and to be protected, in particular, a semiconductor component, includes at least one substantially planar area for covering the at least one component to be protected, one or more moldings serving for mechanical support, at least one of the moldings being in contact with the substrate and/or a supporting element disposed on the substrate after the covering element has been mounted on the subassembly, and the planar area and the molding being disposed such that, in the event of pressure on the covering element, no displacement of the at least one component (4) to be protected occurs.

15 Claims, 2 Drawing Sheets

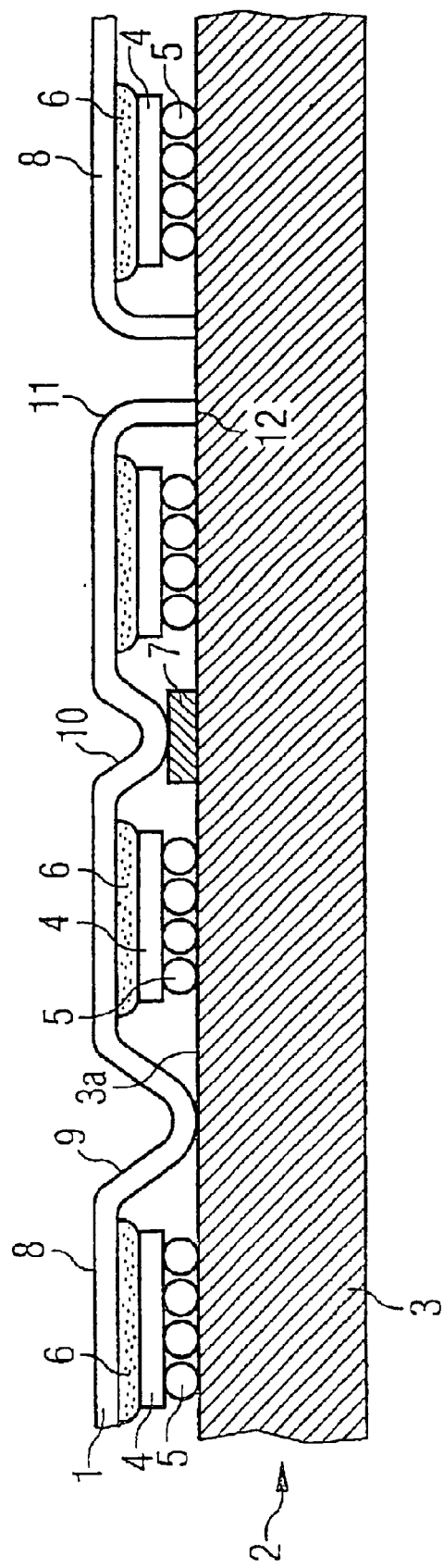

COVERING ELEMENT FOR SUBASSEMBLIES

BACKGROUND OF THE INVENTION

Field of the Invention

The present invention relates to a covering element for covering subassemblies, for example, subassemblies having electronic components.

In the use of integrated semiconductor circuits, chips, as they are referred, that is to say, platelets based on silicon or gallium arsenite and cut out of a wafer with electric components produced photolithographically or by similar methods on its surface, the question is often posed of effective protection against mechanical and/or chemical influences. This question is often answered by introducing the chip into a housing, normally produced from plastic. However, a weak point in the chip mounting lies in the reaction of the electrical contacts between chip and a substrate accommodating the chip, such as a circuit board, to the action of forces on the chip. In the event of displacement of the component or else in the event of direct action on the contact elements, the contact elements can be damaged. As a result of the use of housings, in such a case the problem is merely displaced from the actual chip contacts (for example, thin wires or contact elements similar to balls, ball grid arrays) to the contacts of the housing, even though the latter can normally be more highly loaded mechanically. In principle, however, there remains the problem that the contact elements have too low a resistance against forces acting on the component, for example, the chip.

In recent times, for fabrication reasons and also for reasons concerned with space, economy, and rationalization, use has increasingly been made of what are referred to as flip-chips. These are integrated semiconductors that are fixed directly to the substrate, that is to say the circuit board, without a housing and contacted electrically. For such a purpose, the individual chips still in the wafer composite are provided with suitable flexible contacts and, after the wafer has been cut up, are placed on the substrate with the contact side down. To permit testing of the flip-chips before they are used, customary test devices are used. To be able to use such test devices on the wafer, the contacts have to be configured to be sufficiently compliant so that they are able to compensate for tilting between the surface of the wafer in the area of the flip-chip to be tested and the test device. However, after the flip-chip has been mounted on the substrate, this necessary compliance gives rise to corresponding mechanical sensitivity and leads to an increased need for protective measures.

A further development in recent times has been with regard to what is referred to as microcircuit boards, in which a plurality of chips are applied to the microcircuit board substrate with the structured sides upward and are connected to the conductor track structures of the microcircuit boards by wire bonding. Here, too, protection of the chips and, in particular, of the contact wires, as well, against mechanical effects is desirable.

In the prior art, the protection is normally achieved with a covering that, in specific variants, also serves as a heat spreader. However, in microelectronics it is generally conventional and desirable to reduce the dimensions of components continually. For such a reason, the underside of the coverings comes closer and closer to the actual chips, which can lead to the mechanical problems described above. In particular, as a result of the sometimes-low inherent stiffness of the protective element protecting the actual component, protection of the components lying underneath against compression in the Z direction (that is to say, in a direction at right angles to the plane of the substrate and of the components) is not ensured. In particular, in the case of sensitive components with flexible interconnect elements, this can lead to damage to the component.

SUMMARY OF THE INVENTION

It is accordingly an object of the invention to provide a covering element for subassemblies that overcomes the hereinafore-mentioned disadvantages of the heretofore-known devices of this general type and that provides protection for subassemblies that counteracts compression of a covering.

With the foregoing and other objects in view, there is provided, in accordance with the invention, a covering element for covering at least one subassembly, the subassembly having a substrate with a supporting element and at least one component disposed thereon and to be protected, the covering element including a body having at least one substantially planar area for covering the at least one component to be protected and mechanical support moldings, at least one of the moldings adapted to be in contact with at least one of the substrate and the supporting element disposed on the substrate after the body is mounted on the at least one subassembly, and the planar area and the moldings being shaped and positioned to substantially prevent displacement of the at least one component when pressure is exerted on the body.

The invention is based on the idea of providing a covering element for covering subassemblies whose specific shape limits compression in the Z direction.

In such a case, a subassembly is to be understood to mean an end product of a configuration including a substrate and one or more components. A substrate can be a circuit board made of polymers in the conventional sense, but also a ceramic or metal support on which the components are placed, for example, semiconductor components such as integrated circuits or passive components such as resistors, coils, etc.

The covering element has one or more substantially planar areas for covering the components. These constitute the main areas of the covering element and, in terms of their function, correspond substantially to the coverings in the prior art. The covering element according to the invention can be produced from various materials used in the prior art. For example, it is possible to bend or fabricate the covering element from metals such as steel, copper, or aluminum sheet, but it can also be possible to press, to cast, or, otherwise, to mold the covering element according to the invention from a polymer.

The components to be protected can be of an extremely wide nature. For example, they can be electromechanical or purely mechanical components. One important area of use for the present invention will, however, be in the area of electronics and semiconductor technology, where integrated circuits having a large number of contacts led to the outside have to be protected. It is, therefore, preferred, in particular, for the at least one component to be protected to be a circuit component, in particular, a semiconductor component, connected to electrical contacts. Here, a circuit component is to be understood to mean any integrated circuit with contacts, be it a housed or unhoused chip. Passive components can also fall under the term circuit components, if they need protection. In addition, the substrate can have conductor tracks or structures like conductor tracks to carry electric currents away from the circuit components, if the contacts of the various circuit components are alternatively not directly connected to one another, for example, by the use of wire bonds.

According to the invention, moldings are provided in the covering element and serve to support the covering element in the event of compression from above. Here, the support can be provided, in that, the at least one molding rests directly on the substrate or in that it rests on a supporting element located on the substrate. As a result of providing such moldings, it is possible for the covering element to be displaceable only to a small extent or even not at all toward the semiconductor components in the Z direction because an opposing force is built up in the moldings that compensates for the pressure from above. The invention will function reliably when planar areas and moldings are disposed in relation to one another such that no displacement occurs in the event of pressure on the covering element. Those skilled in the art know how corresponding static stresses in covering elements have to be calculated. For example, in simple embodiments, it may be possible to provide a molding according to the invention centrally on the covering element, beside the edges and at the edges of the coverings (which are incidentally also used in the prior art but cannot fulfill the function according to the invention of a compression safeguard because they cannot support all the areas). In the case of covering elements with relatively large areas, it may be necessary to provide a plurality of moldings, or to position the molding directly beside the element to be protected, such as a semiconductor component.

For the practical configuration of the molding according to the invention, various possibilities are available. For example, the molding can be an indentation that extends from the covering element in the direction of the substrate when the covering element is mounted correctly. Such an indentation can be introduced, for example, by press tools in metal sheets or by extrusion processes in plastic covering elements. It is generally characterized in that the material of the molding has substantially the same material thickness as the rest of the covering element.

The indentation can have an extremely wide range of shapes and, in terms of its shape and depth, is matched to the constructional requirements at the point of the covering element at which it is disposed. The indentation can, preferably, be molded as a longitudinal flute, which is capable of achieving protection against compression, and, therefore, against possible damage to the components to be protected and possibly their contacts over a wide area of the covering element according to the invention.

In accordance with another feature of the invention, a corresponding indentation can also be shaped like a hollow. Here, in the sense of the present invention, this is to be understood to mean any indentation whose edge substantially has a similar dimension from the center (the deepest point) in all directions. This, therefore, includes, for example, circular indentations, elliptical, oval or triangular, square, and pentagonal or polygonal indentations.

Furthermore, the molding can be constructed as an opening in the covering element, whose indented edge comes at least partly into contact with the substrate and/or supporting element disposed on the substrate after the covering element has been mounted on the subassembly. Such openings may be produced, for example, circularly or approximately circularly or rectangularly, from metal sheets by punching tools and can result in a particularly stable molding. By an appropriate tool, in this case the edge is bent over, the material pointing downward forming an edge and the material used for the downwardly pointing area of the opening being the material pressed to the side, preferably, that of the previously substantially planar area at this point of the covering element. Of course, it is also possible to produce appropriate openings in covering elements of plastic by these being molded, for example, concomitantly during an injection molding method.

It is not necessary for the entire downwardly pointing edge of the opening to come into contact with the substrate or the supporting element. Instead, the opening can also be shaped such that only part of the overall edge would be supported or is supported on the substrate or the supporting element when the covering element is compressed.

In accordance with a further feature of the invention, the molding can likewise be a thickening in the covering element. This means that an area of the covering element in such an embodiment does not have the same thickness as the substantially planar areas, and the molding according to the invention is achieved by the greater thickness at this point. Such a thickening can be, for example, a square web, that is to say, an elongate thickening with substantially rectangular edges that points away from the plane on which it is disposed, that is to say, the surface of the covering element that faces the substrate.

It goes without saying that the various exemplary embodiments presented here of the molding according to the invention can be combined with one another as desired if a plurality of moldings are to be provided or must be provided in the covering element. Those skilled in the art are capable of using the calculable static stresses of the covering element ultimately being used and the conditions imposed by the layout of the subassembly to be covered as a basis for implementing suitable configurations of different or identical moldings in the covering element according to the invention.

The molding will normally be supported on the substrate itself, that is to say, come into contact with the latter. However, it may also be that, at a point that is provided for one or more moldings for static stress reasons, contact with the substrate is not possible, for example, because sensitive conductor tracks likewise run in this area. In such a case, it may be expedient to fit a specifically adapted supporting element to the substrate, on which element the molding in the covering element can, in turn, be supported and distributes the forces that act over its base surface. In addition, it is possible that the supporting element disposed on the substrate is a pressure-insensitive component that is present in any case. Such components can be, for example, passive components such as resistors or the like, or else integrated circuits that are connected to the substrate in a pressure-insensitive manner.

In accordance with an added feature of the invention, the covering element is to have a substantially planar area for covering the at least one component to be protected. In this case, a planar area is to be understood to mean that the surface of the covering element forms approximately a plane or a plurality of planes offset vertically in relation to one another (in order to compensate for components of different heights to be protected). The term "planar" can, however, include the fact that structures that are repeated regularly can be present in such an area, but do not have the function of a support but the function of reinforcement. For this reason, the invention can preferably be characterized in that a plurality of reinforcing moldings are disposed in the substantially planar area, which, following mounting, do not come into contact with the covered semiconductor components and that reduce the compliance of the at least one planar area. Such an additional measure can also increase the stability of the planar areas where no moldings that reach as far as the substrate or a supporting element are disposed, and can, therefore, help the width spanned by a planar area between two moldings to be enlarged.

Such a plurality of reinforcing moldings can, for example, form a configuration of ribs or flutes. Other suitable measures can also be taken that improve the stability of the planar areas and their stiffness.

In addition, between all or selected semiconductor components and the planar areas of the covering element located above them, a "gap filler" can be introduced. A gap filler is a plastic compound that, for example, as a result of the addition of metal particles or the like, exhibits a good thermal conductivity and dissipates the heat developed by the current flowing in semiconductor components to the covering element. As already explained above, such covering elements are often likewise used to carry away heat ("heat spreaders"). Gap fillers are not a constituent part of the covering element according to the invention, but are merely in contact with the latter.

The substrate can have any form and function in the prior art. The substrate is preferably a circuit board with contact points to make contact with semiconductor components to be protected. However, it can also be a microcircuit board or a ceramic carrier for corresponding elements. The contact points will normally lie on the circuit board or microcircuit board. However, it is also possible to imagine direct wire connections between different semiconductor components, and the substrate merely serving as a mechanical holder for the various semiconductor components. In such a case, the invention is primarily directed to the protection of such wiring elements because they constitute the most sensitive part of the subassembly to be protected. In particular, the substrate can be a circuit board having conductor tracks and contacts for connection to the at least one semiconductor component.

In accordance with an additional feature of the invention, the body is of metal or of a polymer.

The semiconductor component protected can be any desired component in the prior art, for example, unhoused semiconductors, semiconductors with housings and contact points or, in a preferred embodiment, flip-chips.

The covering element according to the invention can also have fixing elements that fix it to the substrate. These fixing elements can be rivets, for example, which are led through the covering element and the substrate.

Other features that are considered as characteristic for the invention are set forth in the appended claims.

Although the invention is illustrated and described herein as embodied in a covering element for subassemblies, it is, nevertheless, not intended to be limited to the details shown because various modifications and structural changes may be made therein without departing from the spirit of the invention within the scope Band range of equivalents of the claims.

The construction and method of operation of the invention, however, together with additional objects and advantages thereof, will be best understood from the following description of specific embodiments when read in connection with the accompanying drawings.

BRIEF DESCRIPTION OF THE DRAWINGS

FIG. 1 is a fragmentary, cross-sectional view of a covering element for covering a subassembly according to the invention with various types of moldings according to the invention.

DESCRIPTION OF THE PREFERRED EMBODIMENTS

Figure 2A:
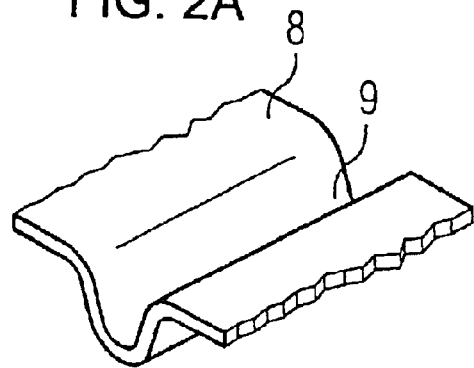
FIGS. 2A to 2D are fragmentary, perspective views of various types of moldings in the covering element of FIG. 1.

Referring now to the figures of the drawings in detail and first, particularly to FIG. 1 thereof, there is shown a covering element according to the invention with moldings of various constructions. The covering element according to the invention is shown, being located on the subassembly 2. The subassembly 2 in the present case includes the substrate 3 and a series of semiconductor components 4, which are connected to conductor tracks of the substrate through contacts 5, for example bumps. In the present, non-limiting exemplary embodiment, there is also a gap filler 6 between the semiconductor components 4 and the substantially planar areas 8 of the covering element 1. Various types of moldings 9, 10, 11 are shown by way of example in FIG. 1. The molding 9 is a molding that has been produced by indenting the material of the covering element 1 or appropriate casting of the covering element 1 and that reaches from the plane of the substantially planar areas 8 down as far as the surface 3a of the substrate 3. The molding 10 can be produced in a similar or identical way to the molding 9. However, it does not reach down as far as the surface 3a of the substrate but instead is supported on the surface of a supporting element 7 that, for example, may be a metal, plastic or ceramic element or a mechanically insensitive component, such as a passive component. Molding 11 is an opening having bent edges, whose edges 12 reach down as far as the surface 3a of the substrate 3. In this way, too, it is possible to achieve support on the substrate and, therefore, compression protection. In exactly the same way as the other types of moldings, the opening 11 may have different shapes. For example, it is possible to provide circular, elongate, oval or else flute-shaped openings in the covering element 1.

FIGS. 2A to 2D show some specific embodiments of the moldings according to the present invention.

FIG. 2A shows a molding 9 in the covering element 1 that is flute-like. This flute-like molding 9 can extend over areas of the covering element or else from one edge to a substantially opposite edge of the covering element.

Figure 2B:
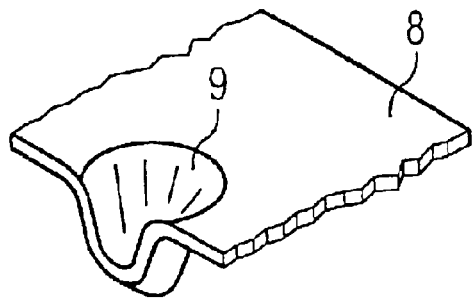

FIG. 2B shows a hollow-like molding 9 that, in the illustration, has a substantially circular outline. By suitable molding actions, the depth of the hollow is made sufficient to come into contact either with the surface 3a of the substrate 3 or with a supporting element 7.

Figure 2C:
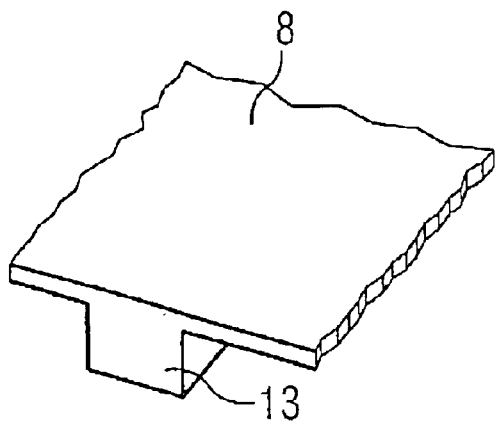

FIG. 2C shows a further embodiment of the molding, in which a web 13 with a rectangular cross section is used, its underside being supported on the substrate or the supporting element.

Figure 2D:
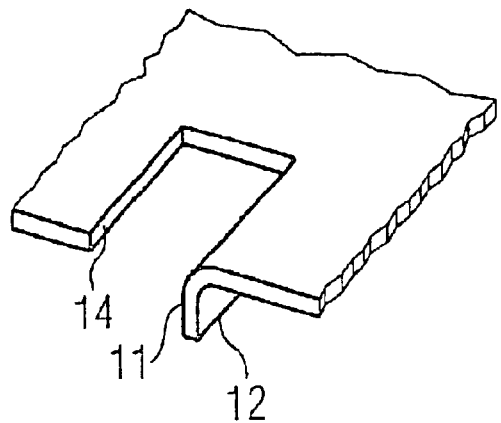

Finally, FIG. 2D shows a further embodiment of the present invention in which, for example, with the aid of a punch tool, an opening has been introduced into the covering element, the material punched out during the punching operation being bent over such that it forms a molding 11 that can come with its edge 12 into contact with the substrate or a supporting element. Other areas of the opening have an edge 14 that is not bent over downward. According to the invention, further variants of such punching operations are possible.

It goes without saying that the present invention is not restricted to moldings of the type described above, instead other configurations can be imagined that satisfy the requirements of the invention on such moldings. It also goes without saying that the covering element can also be subjected to various modifications. For example, it is not necessary for all the substantially planar areas of the covering element to be disposed on one plane, instead, they can be positioned higher and lower (in relation to the substrate).

As the result of the integration, carried out by the invention, of a support into the covering element in the form of a molding in the element, previously necessary process steps in the production of protected subassemblies can be avoided. Additional supporting components, which are separate from the covering element, are just as unnecessary as a so-called underfill, flat blocks that, in the case of subassemblies having semiconductor components, being fitted under these components to support them.

We claim:

1. A subassembly comprising:
   a substrate having a supporting element and at least one component disposed on said substrate;
   a covering element covering the subassembly and protecting said at least one component, the covering element including a body having:
      at least one substantially planar area for covering said at least one component;
      mechanical support moldings, at least one of said moldings adapted to be in contact with at least one of said substrate and said supporting element disposed on the substrate after said body is mounted on the at least one subassembly;
      said moldings including reinforcing moldings disposed at said planar area; and
      said reinforcing moldings not contacting said components following mounting of said body and reducing compliance of said planar area; and
   said planar area and said moldings being shaped and positioned to prevent displacement of said at least one component and of the covering element toward said at least one component when pressure is exerted on said body.

2. The covering element according to claim 1, wherein said at least one component is a circuit component connected to electrical contacts, in particular, a semiconductor component.

3. The covering element according to claim 2, wherein said circuit component is a semiconductor component.

4. The covering element according to claim 1, wherein at least one of said moldings is an indentation.

5. The covering element according to claim 4, wherein said indentation has an elongate flute shape.

6. The covering element according to claim 4, wherein said indentation is a hollow.

7. The covering element according to claim 1, wherein:
   at least one of said moldings is an opening in said body; and
   said opening has an edge at least partly contacting at least one of said substrate and said supporting element after said body is mounted on the subassembly.

8. The covering element according to claim 1, wherein said at least one molding is a thickening in said body.

9. The covering element according to claim 8, wherein said thickening is a web.

10. The covering element according to claim 1, wherein said supporting element disposed on the substrate is a pressure-insensitive component.

11. The covering element according to claim 1, wherein said reinforcing moldings form one of a configuration of ribs and a configuration of flutes.

12. The covering element according to claim 1, wherein said body is formed of metal.

13. The covering element according to claim 1, wherein said body is formed of a polymer.

14. The covering element according to claim 1, including fixing elements for fixing said body to said substrate.

15. The covering element according to claim 14, wherein said fixing elements are rivets.

* * * * *